(12) United States Patent
Hsu et al.

(10) Patent No.: US 6,724,029 B2
(45) Date of Patent: Apr. 20, 2004

(54) TWIN-CELL FLASH MEMORY STRUCTURE AND METHOD

(75) Inventors: Louis L. Hsu, Fishkill, NY (US); Chung H. Lam, Williston, VT (US); Jack A. Mandelman, Stormville, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,831

(22) Filed: Feb. 21, 2002

(65) Prior Publication Data

US 2003/0155599 A1 Aug. 21, 2003

(51) Int. Cl.[7] ............................................. H01L 27/108
(52) U.S. Cl. .................... 257/296; 257/239; 257/301; 257/302; 257/306; 257/316
(58) Field of Search ............................... 257/239, 301, 257/302, 306, 316

(56) References Cited

U.S. PATENT DOCUMENTS

| 4,420,871 | A | | 12/1983 | Scheibe |
| 4,794,565 | A | | 12/1988 | Wu et al. |
| 5,021,848 | A | * | 6/1991 | Chiu ............................ 257/317 |
| 5,053,842 | A | | 10/1991 | Kojima |
| 5,143,860 | A | | 9/1992 | Mitchell et al. |
| 5,229,631 | A | | 7/1993 | Woo |
| 5,267,194 | A | * | 11/1993 | Jang ....................... 365/185.15 |
| 5,278,439 | A | | 1/1994 | Ma et al. |
| 5,350,937 | A | | 9/1994 | Yamazaki et al. |
| 5,402,374 | A | | 3/1995 | Tsuruta et al. |
| 5,422,504 | A | * | 6/1995 | Chang et al. ........... 365/185.15 |
| 5,483,487 | A | | 1/1996 | Sung-Mu |
| 5,554,553 | A | | 9/1996 | Harari |
| 5,587,332 | A | | 12/1996 | Chang et al. |
| 5,612,237 | A | | 3/1997 | Ahn |
| 5,656,544 | A | | 8/1997 | Bergendahl et al. |
| 5,658,816 | A | * | 8/1997 | Rajeevakumar ............. 438/386 |
| 5,801,415 | A | | 9/1998 | Lee et al. |
| 6,228,716 | B1 | | 5/2001 | Wanlass |

FOREIGN PATENT DOCUMENTS

JP        11-186417 A        7/1999

* cited by examiner

Primary Examiner—David Nelms
Assistant Examiner—Mai-Huong Tran
(74) Attorney, Agent, or Firm—Scully, Scott, Murphy & Presser; Mark F. Chadurjian (57) ABSTRACT

A programmable memory cell structure that includes a pair of memory cells is provided. Each pair of memory cells includes a shared control gate and first and second floating gates present about the shared control gate. The first and second floating gates have respective gate regions disposed on respective sides of the control gate. Dielectric structures are present between the control gate and respective ones of the gate regions of the floating gates. The control gate and gates of the first and second floating gates are formed within a single lithographic square.

18 Claims, 8 Drawing Sheets

TWIN-CELL FLASH MEMORY STRUCTURE AND METHOD

BACKGROUND OF THE INVENTION

Field of the Invention

The present invention relates to programmable memory devices such as EEPROMs, nonvolatile memory cells, and flash memory cells. More particularly, the present invention is directed to a twin-cell programmable memory cell structure and to a method of fabricating the same.

Flash memory provides non-volatile memory where blocks of flash memory are erasable in a flash operation. Two well-known types of circuitry that are present in flash memory cells are NAND and NOR. There are a variety of device structures employed for flash memory including two well-known structures, stack gate and split gate. Each of these flash memory structures has it's own inherent strengths and weaknesses associated therewith. A stack gate device, for example, has its channel region covered by a floating gate that is overlapped by a control gate. In a split gate device, a portion of the channel is controlled directly by the control gate, while the remaining portion of the channel is controlled by the floating gate that is modulated by the control gate.

In a conventional high-density, high-speed NOR flash memory, the random access speed is approximately 30 ns, the write speed is approximately 1–10 Å$\mu$s, the write/erase endurance is greater than 106 cycles, the data holding time is greater than 10 years and the cell size is about 0.5 Å$\mu$m2. In a commonly employed n-type MOS flash memory device, a gate oxide having a thickness of from about 7 to about 12 nm is employed, and the channel has a length of about 0.25 to about 0.5 nm.

There are a variety of programming methods available for programming the flash memory by writing the desired information to the cells of the flash memory. One of the most widely employed methods used in programming flash memory cells is by channel hot-electron injection. In such programming and during a write cycle, the control gate of the cell being written to is biased to a high voltage level of approximately 7 to 9 V, while the source is maintained at ground and the drain is biased to 3 to 5 V.

Another commonly employed programming method which is well known to those skilled in the art is Fowler Nordheim (FN) tunneling. In FN tunneling, a relatively high control gate voltage of about 13 to 20 V is needed, while both of the drain and source gates are tied to ground. The high voltage needed in FN tunneling for writing to the flash memory cell is required to form an electric field of approximately 12 mV/cm which is needed to facilitate tunneling of electrons from an inversion layer in the channel area into the floating gate. For an erasure operation, a voltage as high as 12 V is applied to the source gate for a source gate erase, while the substrate is grounded and the drain gate is left floating. Alternatively, a negative voltage of about â€"8 to about â€"9 V is applied to the control gate, a positive voltage of about 3 to about 5 V is applied to the drain node and the source node is left floating.

Flash memory provides the advantage of maintaining storage of data even when power is removed and performing block data erasure so that a partial or full memory macro can be reprogrammed again after the original data is completely erased. However, flash memory typically suffers from having a relatively slow programming speed (and write speed).

In comparison, the random write access time is approximately 1 ns for a state of the art SRAM and approximately 10 ns for a DRAM. Therefore, flash memory is typically employed for storing data for read operations, but not for true high-speed random read/write applications. Once the stored data needs to be altered a relatively long programming time is required.

Flash memory cells typically require that the threshold voltage (Vt) difference between a programmed cell having a state "1" and an un-programmed cell having a state "0" be minimally 2 V. This relatively high Vt difference is needed for at least the following reasons: (1) most flash memory designs use a direct sensing technique that requires sufficient Vt difference between a programmed cell or an un-programmed cell for sensing; (2) a high Vt difference helps to prevent degradation which results in shortened life-time for the flash memory due to Vt disturbances caused by read, write and erase operations; and (3) when Vt for a programmed cell is not high enough an array formed by a plurality of flash memory cells is subjected to direct current leakage that is large and would not be tolerable for a low-power operation involving low Vt levels.

The programming speed associated with flash memory is relatively slow since it depends upon an amount of time required to store an amount of charge required on the floating gate to produce a high enough Vt to produce meaningful Vt shift when a cell changes from a state "0" to a state "1". Typically, flash memory cells are over programmed in order to ensure a uniform Vt of the programmed cells, further increasing the time required to program a cell and decreasing programming speed.

In addition to the above, there are problems typically associated with the accuracy of flash memory cells. Disturbances, such as unintentional voltage coupling by adjacent cells due to read, write, and erase operations, may cause the Vt programmed cells to deviate from the require Vt, generally causing a read or write failure. Flash memory cells having an inherently small size are oftentimes arranged in cross-point array format.

The sensing scheme used for a cross-point array is usually via an open bitline architecture using a single rail direct sensing or dual rail sensing technique, both of which require a reference voltage generator. An insufficient Vt difference may result in a sense margin too small to be reliable, generally causing read and write failure. Furthermore, a marginal sense signal is susceptible to coupling noise, further compromising the data integrity of the flash memory cell. In general, the reliability of the flash memory is limited due to typical inherent sensing limitations associated with a single polarity.

In view of the aforementioned drawbacks with prior art programmable memory cells such as flash memory cells, there is a continued need for providing new and improved programmable memory cells in which the write speed is enhanced without compromising the reliability and durability of the memory cell.

BRIEF SUMMARY OF THE INVENTION

One object of the present invention is to provide a programmable memory cell structure having an array of memory elements, each element having two cells in which the write speed of the memory cell is enhanced.

A further object of the present invention is to provide a programmable memory cell structure having an array of memory elements, each element having two cells in which the write speed is enhanced without compromising the reliability and durability of the memory cell.

A still further object of the present invention is to provide a programmable memory cell structure having an array of memory cell elements, each element having two cells in which storage capacity of the programmable memory cell is increased.

A yet further object of the present invention is to provide a programmable memory cell structure having a reference line that is common to each of the memory cells.

An even further object of the present invention is to provide a programmable memory cell structure in which the wordline of each memory element is formed borderless to the bitline.

A yet even further object of the present invention is to provide a programmable memory cell structure having a plurality of shallow trench isolation regions that are formed self-aligned to the bitline diffusion regions and the floating gate edges.

Another object of the present invention is to provide a programmable memory cell structure in which the bitlines are borderless to the floating gates and the control line.

It is noted that the term "programmable memory cell" includes EEPROMs, non-volatile memory cells, flash memory cells and other like memory cells that can be programmed by applying a voltage thereto.

These and other objects and advantages are achieved in the present invention by providing a novel twin-cell programmable memory cell structure in which a sidewall gate formation technique is employed that is capable of forming the inventive twin-cell in the same density as a conventional single cell array. That is, the first cell is formed on one sidewall of the control gate, and the other cell is formed on the other sidewall. The two cells of the inventive memory cell structure are symmetrical and are located relatively close to each other. Moreover, each cell of the twin cell is tied to its own bitline; however, both cells are modulated by the same control gate. One important advantage of the inventive twin-cell programmable memory cell structure is that not only is the cell-density unchanged, but also one cell can be used as a reference cell as the other cell is sensing.

One aspect of the present invention relates to a pair of programmable memory cells which comprises a shared control gate, first and second floating gates having respective gate regions disposed on respective sides of the control gate, and dielectric structures disposed between said control gate and respective ones of said gates of said floating gates, wherein said control gate and said gates of said first and second floating gates are located within a space of a single lithographic square.

Another aspect of the present invention relates to a pair of programmable memory cells which comprise a single control gate, a first floating gate, a second floating gate, a first bitline, and a second bitline, wherein said control gate is self-aligned to said first and second floating gates.

A still other aspect of the present invention relates to a programmable memory cell layout for a non-volatile memory cell which comprises a programmable memory wordline borderless to a bitline.

A yet other aspect of the present invention is to provide a method for fabricating the inventive twin-cell programmable memory cell structure. Specifically, the method of the present invention includes the steps of:

forming a pair of programmable memory cells in a slot that is present in a pad layer, said pair of programmable memory cells comprising a shared control gate, first and second floating gates having respective gate regions disposed on respective sides of the control gate, and dielectric structures disposed between said control gate and respective ones of said gates of said floating gates, wherein said control gate and said gates of said first and second floating gates are located within a space of a single lithographic square;

removing said pad layer about said slot;

forming first and second bitlines in regions previously occupied by said pad layer; and forming a wordline that is borderless to said first bitline and said second bitline, wherein said wordline is interconnected to said shared control gate.

DETAILED DESCRIPTION OF THE INVENTION

The present invention, which provides a twin-cell programmable memory cell structure and a method of fabricating the same, will now be described in more detail by referring to the drawings that accompany the present application.

Figure 1:
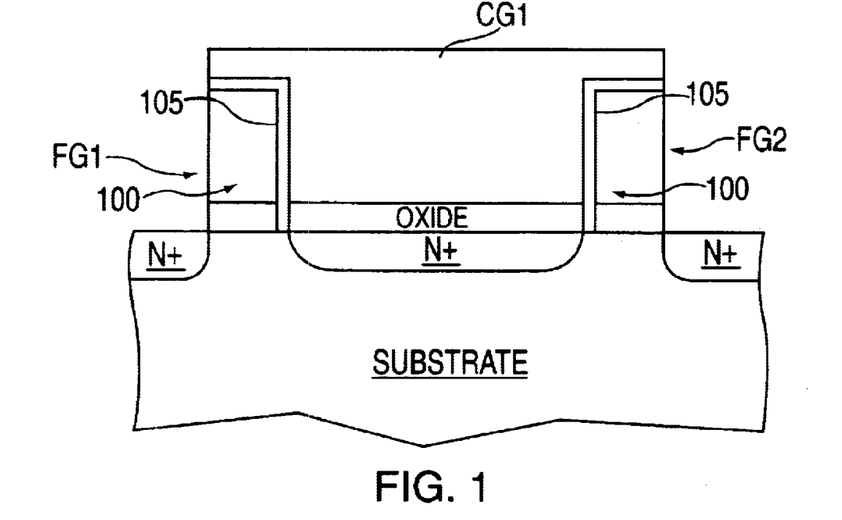
FIG. 1 is a pictorial representation (through a cross-sectional view) illustrating the inventive twin-cell programmable memory cell structure of the present invention.

Reference is first made to the programmable memory cell structure shown in FIG. 1. Specifically, the programmable memory cell structure shown in FIG. 1 comprises a pair of memory cells wherein each memory cell includes shared control gate CG1 and first and second floating gates (FG1 and FG2, respectively) present about shared control gate CG1. First and second floating gates (FG1 and FG2, respectively) have respective gate regions 100 disposed on respective sides of the control gate. Dielectric structures 105 are present between control gate (CG1) and respective ones of the gate regions of the floating gates. In accordance with the present invention, control gate CG1 and gates 100 of first and second floating gate devices (FG1 and FG2, respectively) are formed within a single lithographic square.

In some embodiments of the present invention, the respective heights (h) of control gate CG1 and gates 100 of the first and second floating gate devices are effective to optimize capacitive coupling therebetween.

Reference is now made to FIGS. 2–11 which are pictorial representations through various views illustrating the basic processing steps that are employed in fabricating the inventive twin-cell programmable memory cell structure of the present invention. In these drawings, A designates a top view; B designates a cross-sectional view illustrating an active device area through cut Y1-Y1; and C designates a cross-sectional view illustrating an adjacent shallow trench isolation region through cut Y1-Y2.

Figure 2:
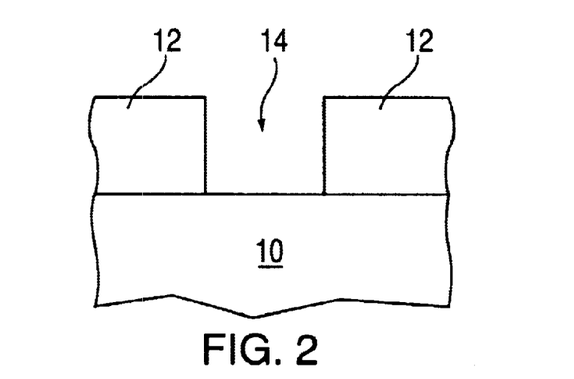
FIGS. 2–11 are pictorial representations showing the basic processing steps used in forming the inventive twin-cell programmable memory cell structure; A is a top view; B is a cross-sectional view through cut Y1-Y1 illustrating one of the active device regions of the inventive structure; and C is a cross-sectional view through cut Y2-Y2 illustrating one of the shallow trench isolation regions of the inventive structure.
Figure 3:
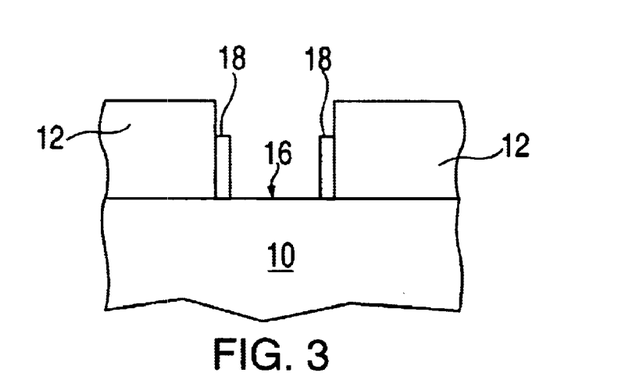

FIG. 2 shows an initial structure that is employed in the present invention. Specifically, the initial structure illustrated in FIG. 2 comprises semiconductor substrate 10, patterned pad layer 12 present atop portions of semiconductor substrate 10 and a plurality of slots 14 (one of which is shown in FIG. 2) that are formed in the pad layer so as to expose a surface portion of substrate 10.

The structure illustrated in FIG. 2 is comprised of conventional materials well known to those skilled in the art and the stucture is fabricated using conventional processing steps that are also well known to those skilled in the art. For example, semiconductor substrate 10 comprises any semiconducting material including, but not limited to: Si, Ge, SiGe, GaAs, InAs, InP and all other III/V semiconductor compounds. Layered substrates, such as Si/SiGe and silicon-on-insulators (SOIs), are also contemplated herein. The substrate may be of the n or p-type depending on the desired device to be fabricated.

Pad layer 12 is formed on a surface of substrate 10 using a conventional deposition process, such as chemical vapor deposition (CVD), plasma-assisted CVD, evaporation and chemical solution deposition, or alternatively, the pad layer may be grown by a conventional thermal oxidation, nitridation or oxynitridation process. The pad layer may also be formed using a combination of these techniques. For example, the pad layer may be formed by thermal oxidation followed by deposition.

Pad layer 12 is composed of an oxide, a nitride, an oxynitride or any combination thereof including a multilayered pad stack. A preferred pad layer employed in the present invention is a pad stack that comprises a deposited nitride formed atop a thermally grown oxide. The thickness of the pad layer may vary and is not critical to the present invention. Typically, pad layer 12 has a thickness of from about 100 to about 500 nm.

Pad layer 12 is then patterned using conventional lithography and etching so as to form a plurality of slots 14 (one of which is shown in the drawings) in the pad layer that expose surface portions of substrate 10. The lithography step employed in the present invention includes applying a photoresist (not shown) to an upper surface of pad layer 12; exposing the photoresist to a pattern of radiation and developing the pattern into the photoresist using a conventional resist developer. The pattern in the photoresist is transferred to pad layer 12 using an etching process such as reactive-ion etching (RIE), ion beam etching, plasma etching, laser ablation or any combination thereof. The etching step may be performed in a single step or multiple etching steps may be employed.

Gate dielectric 16 is then formed on the exposed upper surface of substrate 10 in each slot using a conventional oxidation process or a conventional deposition process. The gate dielectric, which is typically an oxide such as SiO2, has a thickness of from about 1.2 to about 8 nm, with a thickness of from about 1.5 to about 5 nm being more highly preferred.

Following the formation of gate dielectric 16 in each slot, floating gate conductor 18 which is recessed to a predetermined depth below the upper surface of pad layer 12 is formed on exposed sidewalls of pad layer 12. Floating gate conductor 18 employed in the present invention is comprised of a conductive material such as polySi; a conductive elemental metal such as W, Ru, Rh, Pt, and Pd; an alloy which includes at least one of the above mentioned conductive elemental metals; a silicide or nitride of one of the above mentioned conductive elemental metals; or any combination thereof. A preferred floating gate conductor employed in the present invention is polysi which can be formed by an in-situ doping deposition process or deposition followed by ion implantation. The floating gate conductor is formed in the present invention by a conventional deposition process followed by an etching process such as RIE that is highly selective in removing gate conductor as compared to oxide or nitride. It is noted that the etching process employed in the present invention may break through a portion of the underlying gate dielectric and consume some of the substrate. The resultant structure formed after formation of the gate dielectric and floating gates in each slot is shown, for example, in FIG. 3. Note that two floating gate conductors (hereinafter referred to as FG 1 and FG 2) are present in each slot.

Next, reference line 22 which is typically an N+ implant region is formed through exposed surface portions of substrate 10 using ion implantation and annealing. High-density plasma (HPD) oxide 24 is then formed so as to at least cover the exposed surface portion of substrate 10 providing the structure shown, for example, in FIG. 4. Optionally, a resist recess process may be employed to remove any HDP oxide from the top surface of floating gates 18, while protecting HDP oxide 24 on the substrate.

Figure 4:
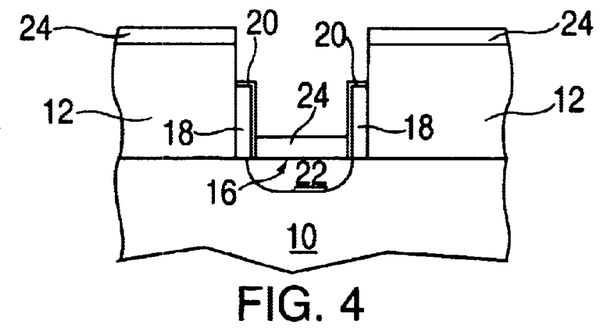

Gate dielectric 20, which may be composed of the same or different dielectric as gate dielectric 16 is then formed on the exposed vertical and horizontal surfaces of floating gate conductor 18 shown in FIG. 4. Gate dielectric 20 (which corresponds to dielectric structure 105 in FIG. 1) is formed using similar processes as mentioned above in connection with gate dielectric 16. Gate dielectric 20 has a thickness that may vary, but typically, gate dielectric has a thickness of from about 7 to about 20 nm.

Figure 5:
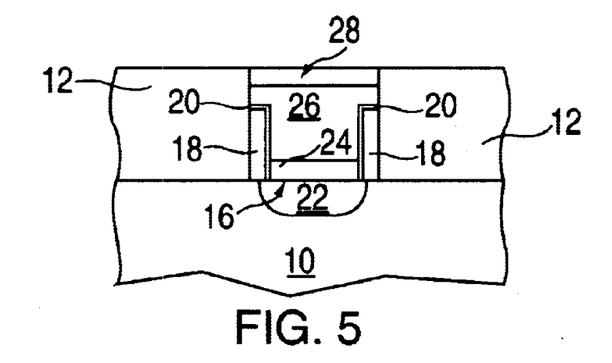

FIG. 5 illustrates the structure that is formed after control gate 26 and oxide capping layer 28 are formed in each slot. Specifically, control gate 26 (which corresponds to GC1 in FIG. 1) is formed as follows: depositing a conductive material which may be the same or different material than the floating gate conductor; planarizing the deposited control gate material; and thereafter recessing the control gate material to a predetermined depth below the upper surface of pad layer 12. Oxide capping layer 28 is then formed atop the control gate using a conventional deposition process followed by planarization.

Figure 6:
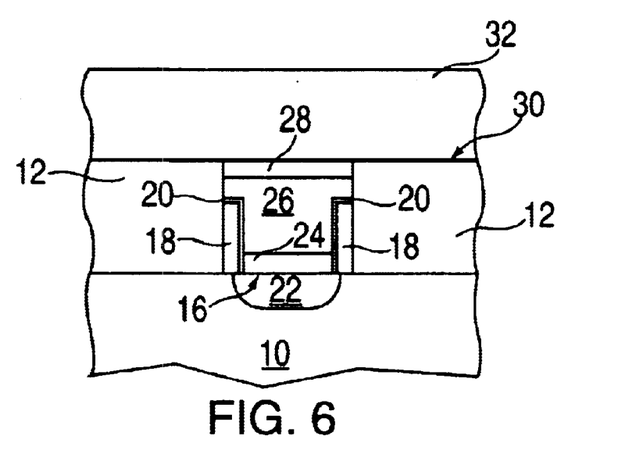

An etch stop oxide layer (labeled as element 30 in FIG. 6) is formed atop the structure shown in FIG. 5, and thereafter SiN layer 32 is formed atop the etch stop oxide layer. The thicknesses of the etch stop oxide layer and the SiN layer are not critical to the present invention so as long as SiN layer is 32 sufficient to provide protection during subsequent processing. FIG. 6 shows the resultant structure having etch stop oxide layer 30 and SiN layer 32 formed thereon.

Figure 7A:
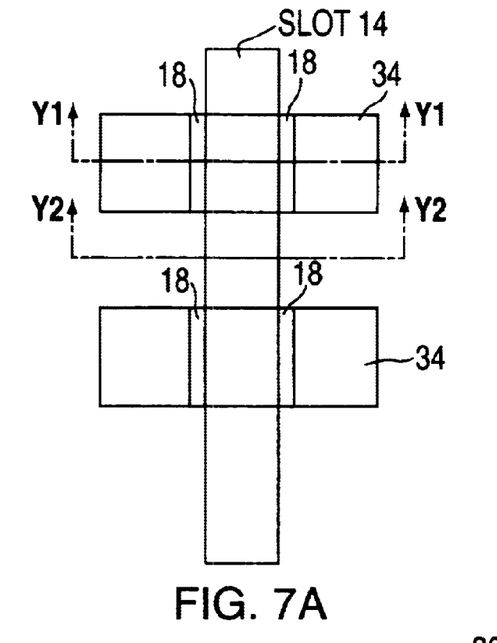
Figure 7B:
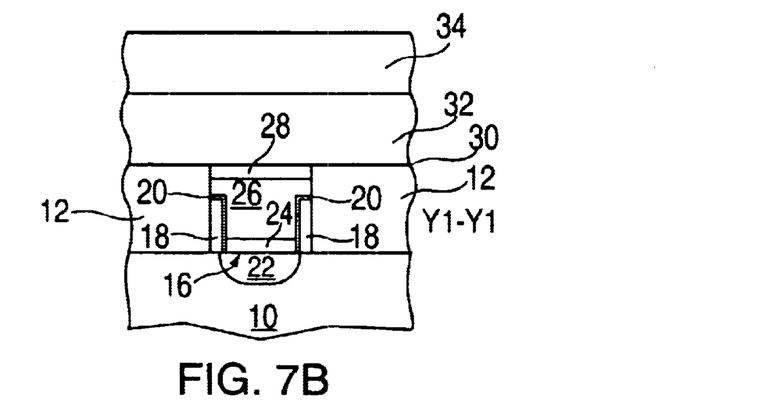
Figure 7C:
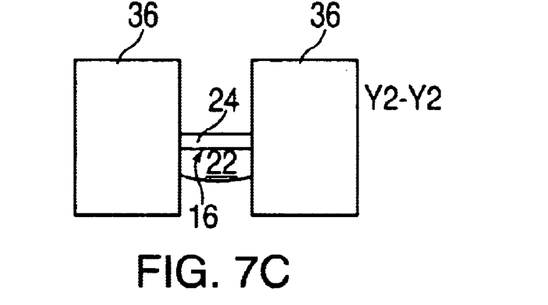

Reference is now made to the structure illustrated in FIGS. 7A, 7B and 7C which show the structure that is formed after active area and shallow trench isolation definition. Specifically, and as shown in FIG. 7A, active area mask 34 having a line-space pattern is formed atop portions of SiN layer 32 so as to protect regions in which active devices are to remain in the structure. The other areas of the structure that are not protected by mask 34 will be regions in which shallow trench isolation regions will be formed.

To form the shallow trench isolation (STI) regions, SiN layer 32 not protected by mask 34 is removed using an etching process that is highly selective in removing nitride as compared to oxide. This etching step stops on an upper surface layer of etch stop oxide layer 30. The exposed etch stop oxide layer is then removed from the areas where STI regions are to be formed using an etching process that is highly selective in removing oxide as compared to pad material. The exposed pad material (layer 12) in the STI regions is then removed stopping on the surface of substrate 10 utilizing an etching process that is highly selective in removing pad material from the structure.

Exposed portions of substrate 10 are then etched using a timed etching process such that shallow trenches are formed in the exposed portions of the substrate. Note that at this point of the inventive process, the control gate/floating gate structure provided above remains in the STI regions because of the presence of oxide capping layer 28. The shallow trenches are then filled with a trench dielectric material such as HDP oxide or TEOS (tetraethylorthosilicate) and planarized. In some embodiments, a liner (not shown) such as SiO2 or Si3N4 is formed on the walls of each trench prior to filling with a trench dielectric material.

After STI fill and planarization, the remaining oxide capping layer in the STI regions is removed using an etching process that is capable of selectively removing oxide so as to expose the control gate conductor. Note that a negligible amount of trench fill material may be removed during this step of the present invention. The exposed control gate conductor in the STI regions is then etched to the upper surface of each floating gate region and to the HDP oxide formed in the bottom of the slot. Each floating gate region (including floating gate conductor and gate dielectric) is then removed using an etching process that is capable of removing the floating gate region from the structure providing the STI structure illustrated in FIG. 7C. Note that the STI region is labeled as reference numeral 36 in FIG. 7C. Because of the presence of mask 34, some of the previously formed control gate/floating gate structures remain. See, for example, 7B.

Figure 8A:
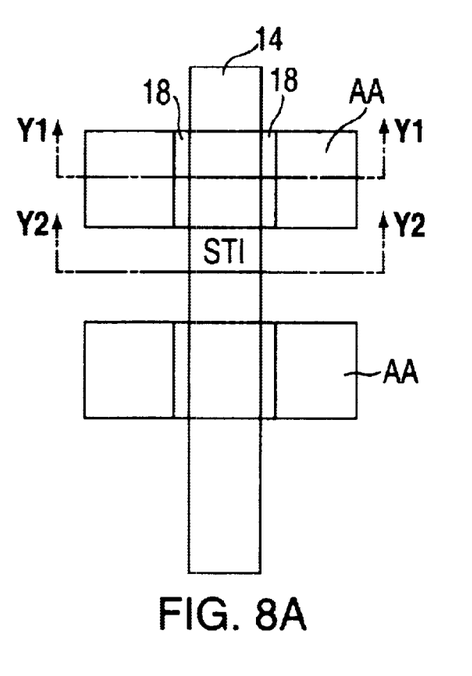
Figure 8B:
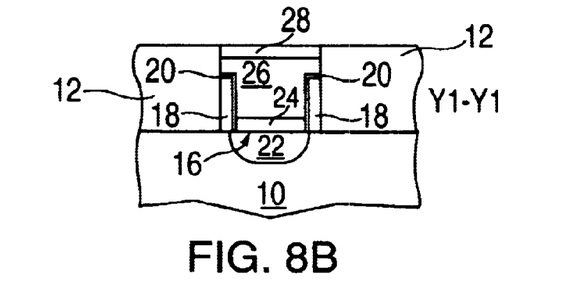
Figure 8C:
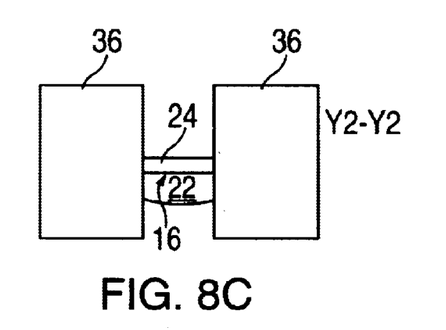
Figure 9A:
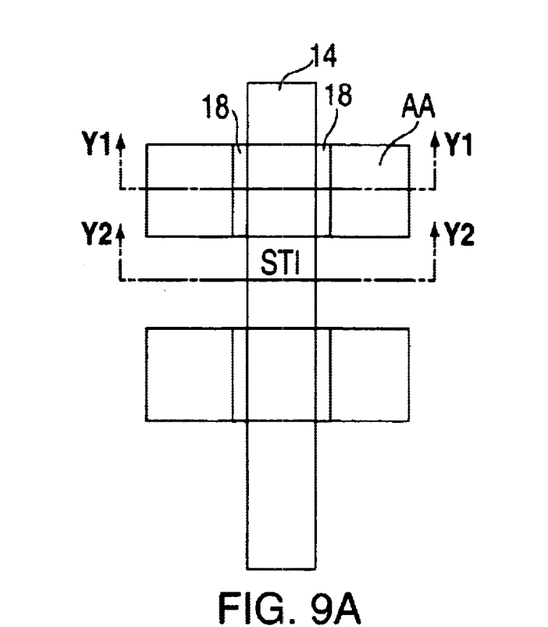
Figure 9B:
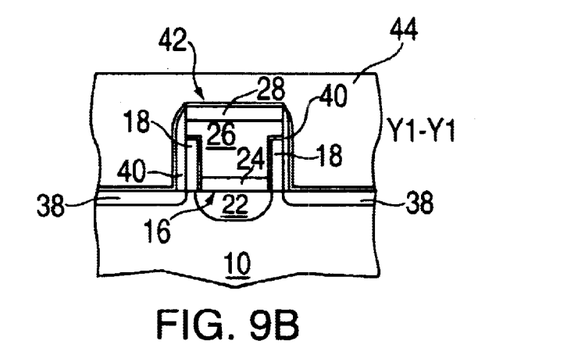
Figure 9C:
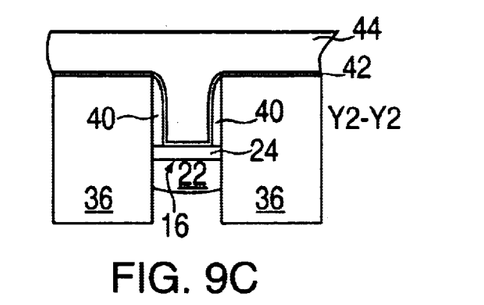

Next, and as shown in FIGS. 8A, 8B and 8C, mask 34 is removed from the structure, and thereafter remaining SiN layer 32 and etch stop oxide layer 30 are removed from the active device areas (designed hereinafter by M) using conventional etching processes well known in the art.

Pad layer 12 is then removed from the AA exposing portions of the substrate utilizing a conventional etching process that is highly selective in removing pad material from the structure. Next, bitline diffusion regions 38 are formed in the exposed portions of the substrate utilizing conventional ion implantation and annealing. Typically, the bitline diffusion regions are N+ diffusion regions. Note that the bitline diffusion regions are self-aligned with outer edges of the control gate/floating gate structure.

After bitline diffusion regions 38 have been formed, spacers 40 which are composed of any insulating material such as an oxide, nitride or oxynitride, are then formed on outer edges of the control gate/floating gate structure and on the sidewalls of the STI regions. The spacers are formed by deposition and etching. In the AA and the STI region, a thin SiN etch stop layer 42 is formed via deposition and thereafter a planarized doped silicate glass layer 44 such as boron phosphorus doped silicate glass is formed atop the surface of SiN etch stop 42 utilizing deposition and planarization. The resultant structure that is formed after the above processing steps have been formed to the structure shown in FIGS. 8A–C, is shown, for example, in FIGS. 9A, 9B and 9C.

Figure 10A:
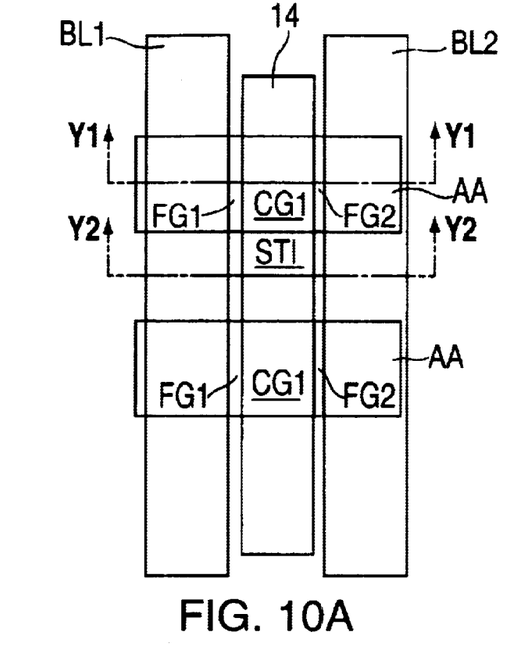
Figure 10B:
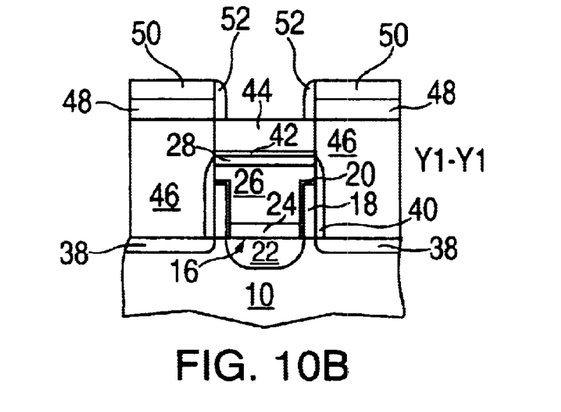
Figure 10C:
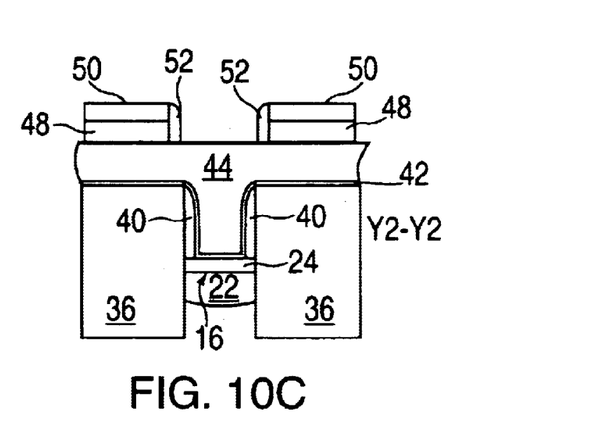

Reference is now made to FIGS. 10A, 10B and 10C in which bitlines are formed in both the AA as well as the STI region. Specifically, in the AA, portions of doped silicate glass 44 that lie adjacent to the control gate/floating gate region over the bitline diffusion regions are removed using an etching process that stops atop the surface of SiN etch stop layer 42. The exposed SiN etch stop layer is then removed from the AA utilizing a selective etching process so as to expose portions of substrate 10 which include bitline diffusion regions 38. Contact bitline polySi regions or other conductive material 46 are then deposited and planarized so as to be substantially coplanar with the remaining doped silicate glass material in the structure.

A bitline metal (labeled as 48) such as W and a bitline capping layer (labeled as 50) such as SiN is then deposited in both the AA and the STI regions and thereafter the bitline metal and the bitline capping layer are patterned so as to form the structure illustrated in FIGS. 10A, 10B and 10C. Note that after the bitline and the bitline capping layer have been patterned SiN spacers 52 are formed on exposed sidewalls of these patterned layers. Spacers 52 are formed by deposition and etching.

If required, additional doped silicate glass material may be deposited to build up the thickness of the doped silicate glass over the bitline capping layer. A wordline photoresist mask (not shown) is then applied to the structure and thereafter a pattern of lines and spaces is formed in the wordline mask. Note that the spaces in the wordline mask are in the AA of the structure. Next, exposed portions of the doped silicate glass remaining in the AA above the control gate/floating gate structure are removed utilizing an etching process that is highly selective in removing doped silicate glass from the structure stopping atop SiN etch stop 42. This etching step creates slots in which the wordlines will be subsequently formed.

The exposed SiN etch stop layer is then removed from the slots using an etching process that selectively removes nitride as compared to oxide so as to stop atop oxide capping layer 28. The exposed oxide capping layer is then removed so as to expose portions of the control gate conductor. Next, a wordline gate conductor 54 such as W is deposited and planarized in the slots providing the structure illustrated in FIGS. 11A, 11B and 11C.

Figure 11A:
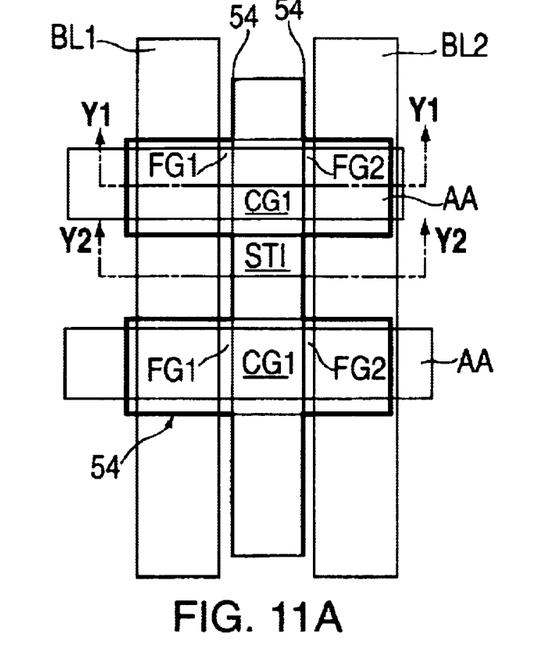
Figure 11B:
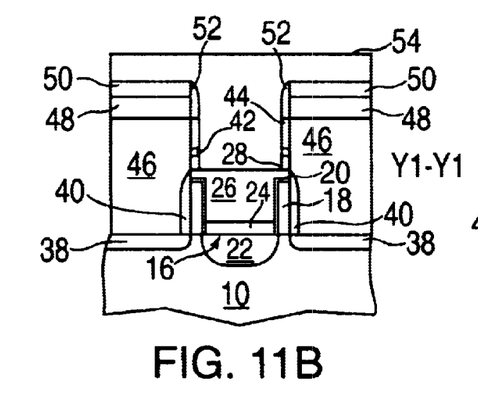
Figure 11C:
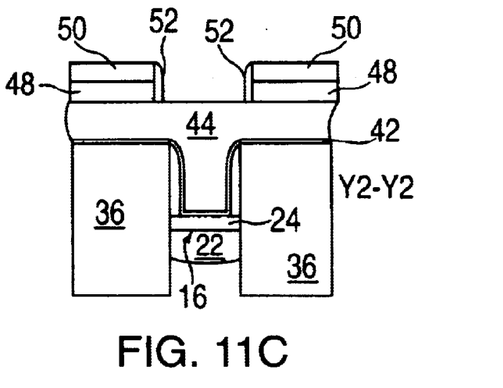

Note the structure shown in FIGS. 11A–C includes a pair of programmable cells comprising a single control gate (labeled as CG1), a first floating gate (labeled as FG1), a second floating gate (labeled as FG2), a first bitline (labeled as BL1), and a second bitline (labeled as BL2). One feature to note is that the control gate is self-aligned to the first and second floating gates. Note that in the structure shown in FIGS. 11A–C, BL1 is borderless to FG1, and BL2 is borderless to FG2.

Another feature to note is that wordline 54 is connected to the control gate, and that BL1 and BL2 are both borderless to the control and the wordline. Note that in the inventive structure, the coupling between the floating gates and the control gate is controllable by the height of the floating gate and the thickness of gate dielectric 20.

The inventive layout provided herein provides a wordline that is borderless to a bitline. Such a feature is not present in prior art twin-cell programmable memory structures known to applicants. The advantage of this feature is that the inventive layout is very insensitive to alignment tolerances. It is also noted that in the claimed structure the wordlines lie orthogonal to the bitlines.

Figure 12:
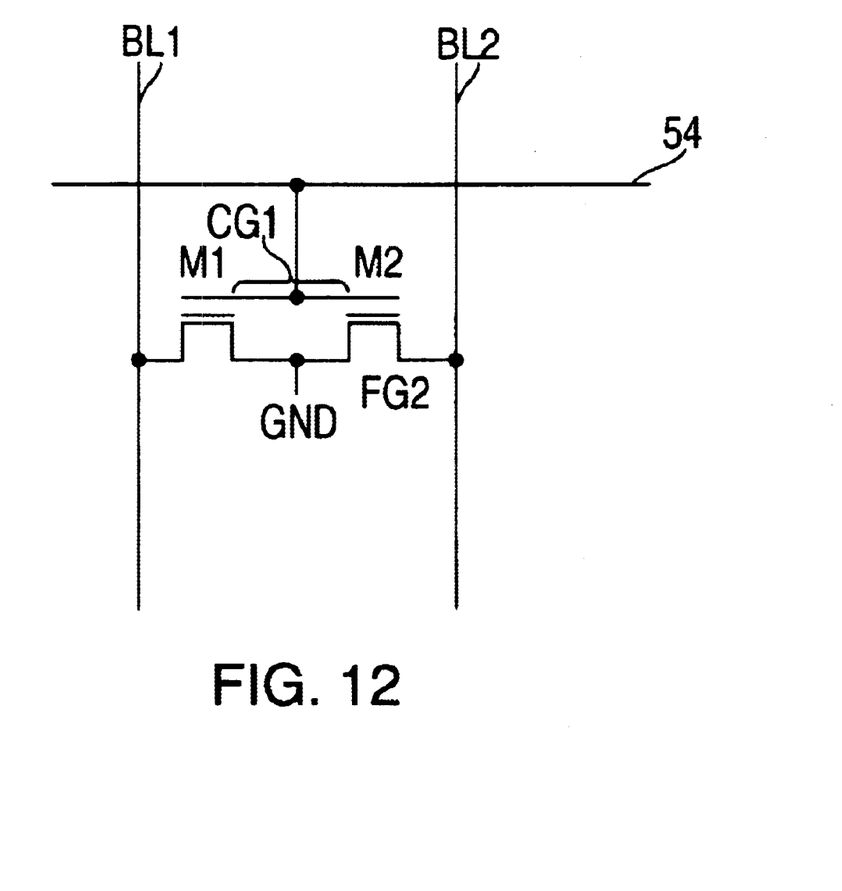
FIG. 12 is a schematic showing the circuitry of the inventive twin-cell programmable memory structure.

Reference is now made to the circuit schematic shown in FIG. 12. Note that the reference numerals used in this drawing correspond to the reference numerals previously mentioned herein. Specifically, the circuit schematic shown in FIG. 12 includes common control gate CG1 which serves to modulate both FG1 and FG2. The source ends of each floating gate are connected to ground, Gnd, while the drain ends of each floating are connected to a complementary bitline, e.g., BL1 and BL2. Note that the common control gate is coupled to wordline 54, which runs orthogonal to BL1 and BL2. M1 and M2 denote a pair of memory cells, where M1 is comprised of FG1 and CG1, and M2 is comprised of FG2 and CG1.

Unlike conventional two-bit cells, each twin cell of the present invention stores only one true and compliment bit. For example, if a "high" is stored into the cell, the Â½ cell M1 is programmed. On the other hand, if a "low" is stored into the cell, then the other Â½ cell M2 is programmed. When reading the cell, always a pair of differential signal is sensed, and therefore signal read margin is 2× wider than the conventional cell. If the signal margin is maintained unchanged, then the write (or programming) time can be reduced since a lower Vt shift is required at this moment.

Devices will be implanted with different doping concentration than the conventional high Vt case. After programming, the device Vt will be saturated at a lower level than that of the conventional flash memory.

Unlike the conventional two-bit cell, each Â½ cell M1 and M2 are stored with a pair of complementary data. During sensing, both bitlines, BL1 and BL2, are employed to develop a differential signal. The twin-cell concept described herein may lead to a lower programming voltage or shorter programming time since Vt of the devices need not be raised excessively during programming. A feature of the inventive twin-cell memory device is that a denser cell layout is provided which is not found in any prior art programmable memory cell known to applicants.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A pair of programmable memory cells comprising a shared control gate, first and second floating gates having respective gate regions located on respective sides of the control gate, and dielectric structures located between said control gate and respective ones of said gates of said floating gates, wherein said control gate includes portions that lay above said floating gates, and said control gate and said gates of said first and second floating gates are located within a space of a single lithographic square.

2. The pair of programmable memory cells of claim 1 wherein respective heights of said control gate and said gates of said first and said second floating gate devices are optimize to achieve capacitance coupling therebetween.

3. The pair of programmable memory cells of claim 1 further comprising a first bitline and a second bitline, wherein said first bitline is borderless to said first floating gate and said second bitline is borderless to said second floating gate.

4. The pair of programmable memory cells of claim 1 further comprising a wordline interconnected to said control gate.

5. The pair of programmable memory cells of claim 1 further comprising shallow trench isolation regions, said shallow trench isolation regions being located adjacent to said pair of memory cells.

6. The pair of programmable memory cells of claim 5 wherein said shallow trench isolation regions are formed self-aligned to bitline diffusion regions that abut said pair of memory cells and edges of said first and second floating gates.

7. The pair of programmable memory cells of claim 1 further comprising a common reference line that is located beneath an insulated portion of said control gate.

8. The pair of programmable memory cells of claim 1 wherein said cells are EEPROM memory cells, non-volatile memory cells or flash memory cells.

9. The pair of programmable memory cells of claim 5 further comprising patterned bitlines formed above said shallow trench isolation regions.

10. A pair of programmable memory cells comprising a single control gate, a first floating gate, a second floating gate, a first bitline, and a second bitline, wherein said control gate is self-aligned to said first and second floating gates.

11. The pair of programmable memory cells of claim 10 wherein said first bitline is borderless to said first floating gate and said second bitline is borderless to said second floating gate.

12. The pair of programmable memory cells of claim 10 further comprising a wordline connected to said control gate, wherein said first bitline and said second bitline are both borderless to said control gate and said wordline.

13. The pair of programmable memory cells of claim 10 wherein coupling between said floating gates and said control gate is controllable by heights of said floating gates.

14. The pair of programmable memory cells of claim 10 further comprising shallow trench isolation regions, said shallow trench isolation regions being located adjacent to said pair of programmable memory cells.

15. The pair of programmable memory cells of claim 14 wherein said shallow trench isolation regions are formed self-aligned to bitline diffusion regions that abut said pair of memory cells and edges of said first and second floating gates.

16. The pair of programmable memory cells of claim 10 further comprising a common reference line that is located beneath an insulated portion of said control gate.

17. The pair of programmable memory cells of claim 10 wherein said cells are EEPROM memory cells, non-volatile memory cells or flash memory cells.

18. A layout for a non-volatile memory cell comprising a programmable memory cell comprising a shared control gate, first and second floating gates having respective sate regions located on respective sides of the control gate, and dielectric structures located between said control gate and respective ones of said sates of said floating gates, wherein said control gate includes portions that lay above said floating gates, said shared control gate coupled to a wordline that is borderless to an orthogonal bitline.

* * * * *